US012237662B2

(12) United States Patent
Kim et al.

(10) Patent No.: US 12,237,662 B2
(45) Date of Patent: *Feb. 25, 2025

(54) SHORT CIRCUIT PROTECTION

(71) Applicant: TEXAS INSTRUMENTS INCORPORATED, Dallas, TX (US)

(72) Inventors: Eung Jung Kim, Allen, TX (US); Wenchao Qu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/469,109

(22) Filed: Sep. 18, 2023

(65) Prior Publication Data

US 2024/0006869 A1    Jan. 4, 2024

Related U.S. Application Data

(63) Continuation of application No. 17/514,774, filed on Oct. 29, 2021, now Pat. No. 11,799,281.

(60) Provisional application No. 63/184,005, filed on May 4, 2021.

(51) Int. Cl.
| | |
|---|---|
| *H02H 3/08* | (2006.01) |
| *H02H 1/06* | (2006.01) |
| *H02H 9/02* | (2006.01) |

(52) U.S. Cl.
CPC ............... *H02H 3/08* (2013.01); *H02H 1/06* (2013.01)

(58) Field of Classification Search
CPC .......... H02H 3/08; H02H 1/06; H03K 17/082
USPC ....................................................... 361/93.1
See application file for complete search history.

(56) References Cited

U.S. PATENT DOCUMENTS

| | | |
|---|---|---|
| 6,169,439 B1 | 1/2001 | Teggatz |
| 6,388,521 B1 | 5/2002 | Henry |
| 2005/0013079 A1 | 1/2005 | Mitsuda |
| 2012/0293017 A1 | 11/2012 | Lidsky |
| 2019/0245530 A1 | 8/2019 | Roy |
| 2019/0260370 A1 | 8/2019 | Nakagawa |

FOREIGN PATENT DOCUMENTS

WO      2012148774 A2    11/2012

OTHER PUBLICATIONS

Passetti, et al. "An Integrated Smart Driver for Inductive Loads with Self-Monitoring/Diagnostic Capability," Power Electronics, Electrical Drives, Automation and Motion (SPEEDAM), 2012 International Symposium on, IEEE, Jun. 20, 2012, pp. 1007-1011.
Search Report dated Jul. 28, 2022.

*Primary Examiner* — Danny Nguyen
*Assistant Examiner* — Lucy M Thomas
(74) *Attorney, Agent, or Firm* — Ray A. King; Frank D. Cimino

(57) ABSTRACT

In some examples, this description provides for an apparatus. The apparatus includes a power switch having a power switch source configured to receive an input voltage, a power switch drain, and a power switch gate. The apparatus also includes a current sense component coupled to the power switch. The apparatus also includes a current limiting circuit coupled to the power switch gate, the power switch drain, and the current sense component. The apparatus also includes an over-current protection (OCP) circuit coupled to the power switch source, the power switch drain, and the power switch gate. The apparatus also includes an output voltage (VOUT) clamp coupled to the power switch drain and the power switch gate.

16 Claims, 5 Drawing Sheets

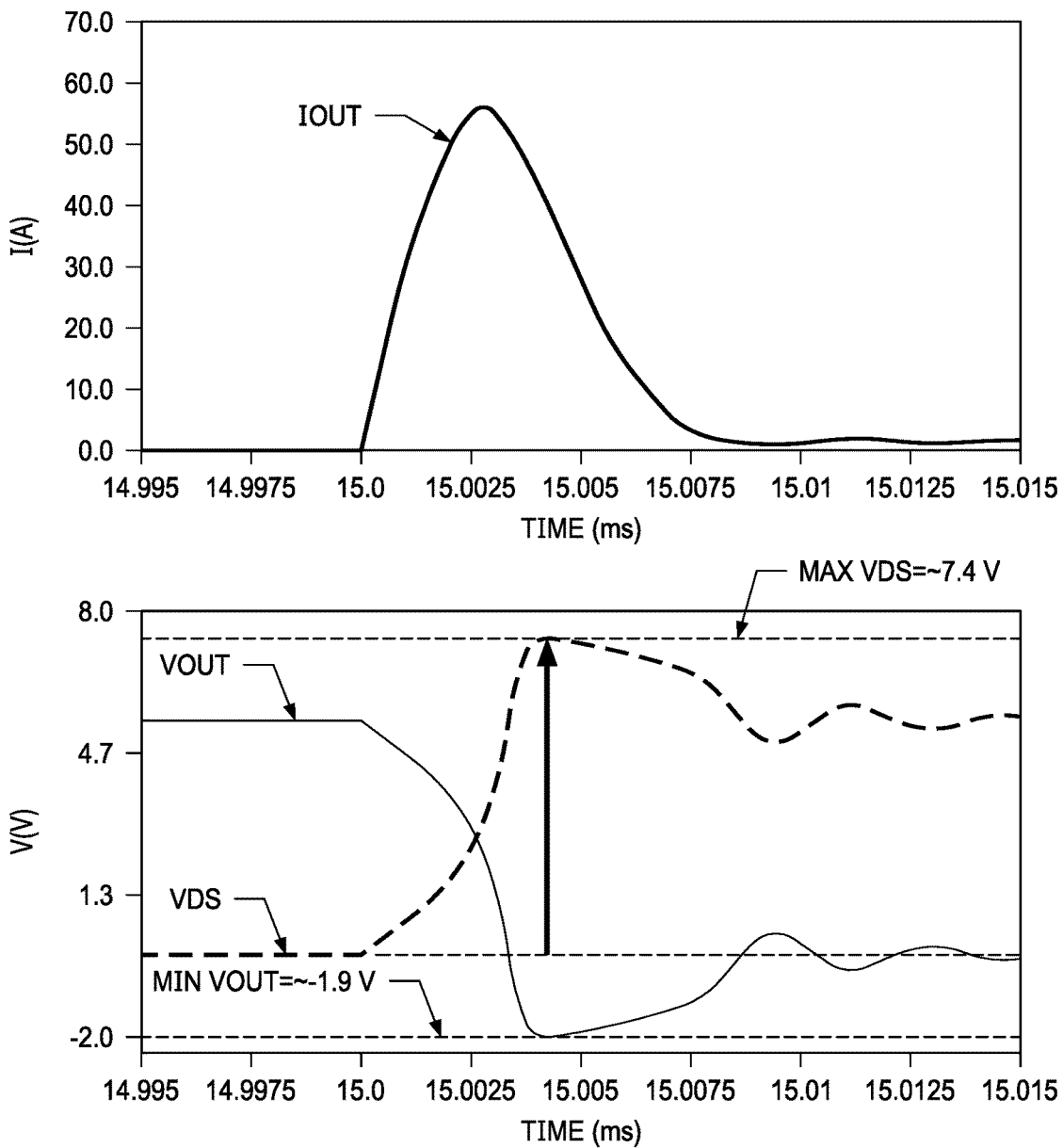

SHORT CIRCUIT PROTECTION

CROSS-REFERENCE TO RELATED APPLICATIONS

This application is a continuation of U.S. patent application Ser. No. 17/514,774, filed Oct. 29, 2021, which claims priority to U.S. Provisional Patent Application No. 63/184,005, which was filed May 4, 2021, both are hereby incorporated herein by reference in their entirety.

BACKGROUND

Power switches that operate as load switches in a device may be exposed to various load conditions such as large inductive loads, small inductive loads, various load capacitances, and the like. Sometimes, load conditions can create a short circuit at the power switch.

SUMMARY

In some examples, an apparatus includes a power switch having a power switch source configured to receive an input voltage, a power switch drain, and a power switch gate. The apparatus also includes a current sense component coupled to the power switch. The apparatus also includes a current limiting circuit coupled to the power switch gate, the power switch drain, and the current sense component. The apparatus also includes an over-current protection (OCP) circuit coupled to the power switch source, the power switch drain, and the power switch gate. The apparatus also includes an output voltage (VOUT) clamp coupled to the power switch drain and the power switch gate.

In some examples, an apparatus includes a power switch configured to provide power to a load. The apparatus also includes a current limiting circuit coupled to the power switch, the current limiting circuit configured to control the power switch to regulate a value of an output current (IOUT) provided to the load with respect to a first threshold. The apparatus also includes an OCP circuit coupled to the power switch, the OCP circuit configured to control the power switch to regulate the value of IOUT with respect to a second threshold that is greater than the first threshold. The apparatus also includes an VOUT clamp coupled to the power switch, the VOUT clamp configured to control the power switch to maintain a value of an output voltage of the apparatus greater than a third threshold.

In some examples, a system includes a first circuit board that includes a power circuit, a second circuit board, and a conductor coupled between the power circuit and the second circuit board. The power circuit includes a power switch configured to provide power to the second circuit board via the conductor. The power circuit also includes a current limiting circuit coupled to the power switch, the current limiting circuit configured to control the power switch to regulate a value of an TOUT provided to the second circuit board with respect to a first threshold. The power circuit also includes an OCP circuit coupled to the power switch, the OCP circuit configured to control the power switch to regulate the value of TOUT with respect to a second threshold that is greater than the first threshold. The power circuit also includes an VOUT clamp coupled to the power switch, the VOUT clamp configured to control the power switch to maintain a value of an output voltage of the apparatus greater than a third threshold that is a negative value.

BRIEF DESCRIPTION OF THE DRAWINGS

FIG. 4A is a graph of signals in a power circuit, in accordance with various examples.

DETAILED DESCRIPTION

Load switches include short circuit protection to protect the load switch in the event of a short circuit. Often, trade-offs exist in providing short circuit protection. For example, transient response speed may be sacrificed to increase short circuit protection, or vice versa. Widely varying load conditions that may be faced by a load switch may create challenges in designing short circuit protection for the load switch while also maintaining a low power, and low surface area, design for the load switch.

This description provides for short circuit protection. In some examples, the short circuit protection is applied to low voltage power switches, such as field-effect transistors (FETs), operating as load switches. The power switches may be susceptible to effects of a wide range of output inductance, output capacitance, and/or output resistance such as may create challenges in designing short circuit protection for the power switches. In some examples, the short circuit protection includes multiple facets, including at least current limiting, over-current protection, and an output voltage (VOUT) clamp. In some implementations of such examples, the current limiting may be implemented by a servo control loop, the over-current protection may be implemented by an over-current protection detection circuit, and the VOUT voltage clamp may be implemented by competing circuits configured to operate in contrast to one another, creating a hysteresis effect.

Figure 1:
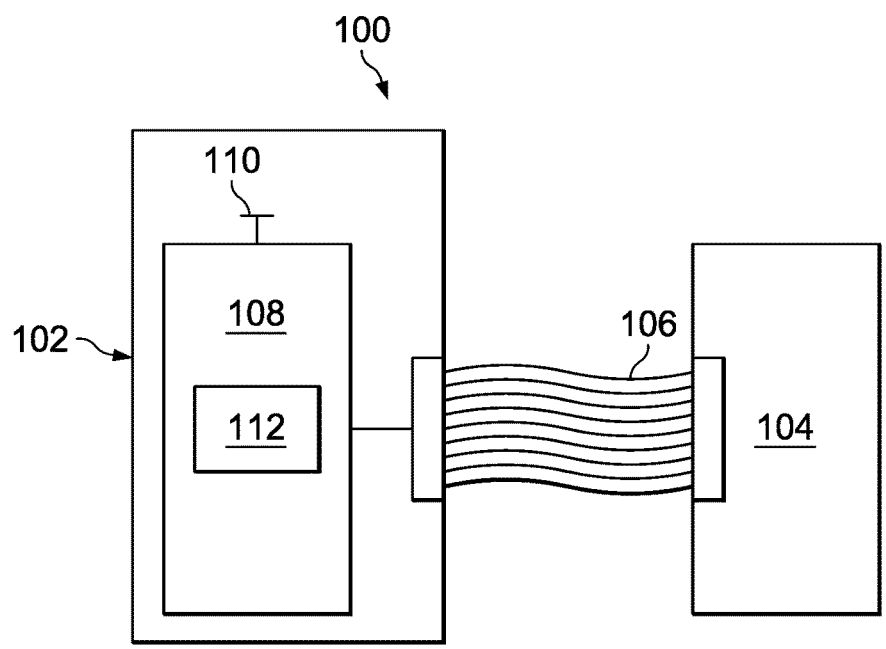
FIG. 1 is a block diagram of a system, in accordance with various examples.

FIG. 1 is a block diagram of a system 100, in accordance with various examples. In at least some examples, the system 100 is representative of a device that includes a circuit board 102 and a circuit board 104. The circuit board 102 may be communicatively coupled to the circuit board 104 via a conductor 106, such as a ribbon cable or other component that may be susceptible to short circuits. The circuit board 102 includes a power circuit 108 coupled between a power supply 110 and the conductor 106. The power circuit 108 includes a short circuit protection circuit 112 configured to protect a power switch (not shown) of the power circuit 108 from damage in the event of a short circuit, such as a short circuit involving the conductor 106.

Figure 2:
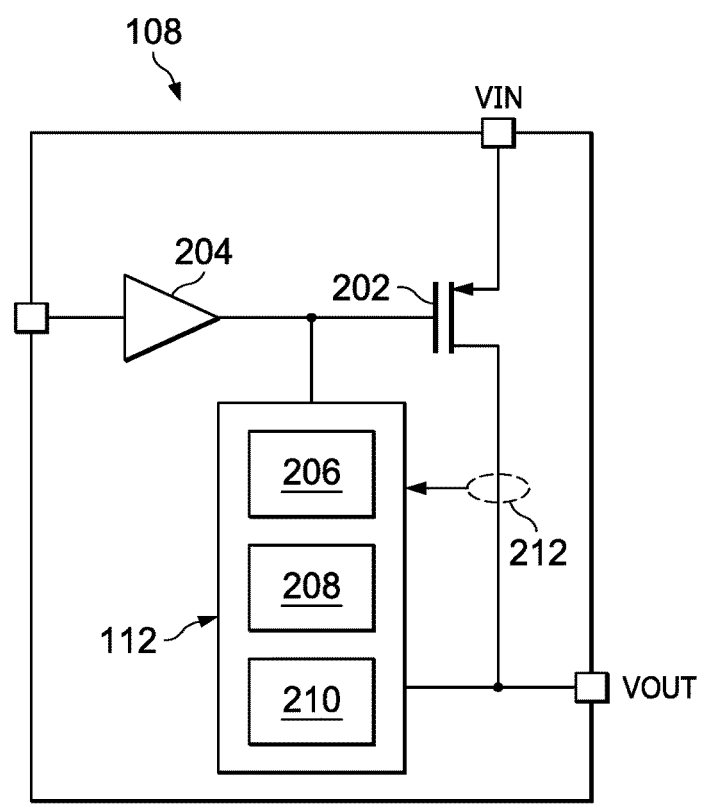
FIG. 2 is a block diagram of a power circuit, in accordance with various examples.

FIG. 2 is a block diagram of the power circuit 108, in accordance with various examples. In at least some examples, the power circuit includes a power switch 202, a gate driver 204, and the short circuit protection circuit 112. In various examples, the short circuit protection circuit 112 includes a current limiting circuit 206, an over-current protection (OCP) circuit 208, and a VOUT clamp 210. In an example architecture of the power circuit 108, the power switch 202 has a source coupled to an input voltage (VIN) terminal, a drain coupled to a VOUT terminal, and a gate. The gate driver 204 has an output coupled to the gate of the power switch 202, and an input configured to receive a control signal for controlling the power switch 202. For example, responsive to the gate of the power switch 202 being pulled low, such as to cause a gate-to-source voltage (Vgs) of the power switch 202 to become less than a threshold amount, the power switch 202 becomes conductive between its source and drain, provided VOUT to the VOUT terminal. The short circuit protection circuit 112 is coupled to the gate of the power switch 202, the VOUT terminal, and a current sense component 212 that provides a signal (ISNS) representative of an output current (IOUT) of the power circuit 108.

In at least some examples, the short circuit protection circuit 112 is configured to monitor operation of the power switch 202 and exert control over the power switch 202. In some examples, that control is performed by the current limiting circuit 206. The current limiting circuit 206 may be, or include, a servo-loop based current limit controller. The current limiting controller controls the power switch 202 to maintain a value of TOUT less than or equal to a threshold amount, ILIM_servo. However, the current limiting circuit 206 may be inherently slow to respond to transient events resulting from the servo-based nature of the current limiting circuit 206. As such, the current limiting circuit 206 may be incapable of preventing IOUT from rapidly exceeding ILIM_servo responsive to a rapid increase in value of TOUT, such as resulting from a short circuit affecting the power circuit 108. In some examples, the OCP circuit 208 detects the rapid increase in value of TOUT and, responsive to TOUT becoming greater than another threshold amount, ILIM_ocp, provides a control signal, OCP, having an asserted value. In at least some examples, ILIM_ocp is larger in value than ILIM_servo.

Responsive to assertion of OCP, the current limiting circuit 206 is electrically decoupled from the gate of the power switch 202. Also, responsive to assertion of OCP, the OCP circuit 208 increases Vgs of the power switch 202 to reduce current flow through the power switch 202 and reduce the value of TOUT. In conjunction with the OCP circuit 208 decreasing Vgs of the power switch 202, the VOUT clamp 210 attempts to increase Vgs of the power switch 202. For example, responsive to the VOUT clamp 210 determining that VOUT has a value less than −1 volt (V), the VOUT clamp may provide a control signal, NEG_OUT, having an asserted value. Responsive to assertion of NEG_OUT, the OCP circuit 208 may cease efforts to control the gate of the power switch 202 and the VOUT clamp 210 may exert control over the gate of the power switch 202, decreasing Vgs of the power switch 202.

Responsive to the VOUT clamp 210 determining that VOUT has increased to be greater than a threshold amount, such as about −1 V, the VOUT clamp may provide NEG_OUT having a deasserted value. The threshold amount may be related to a drain-to-source voltage (Vds) of the power switch 202, such as a Vds for which the power switch 202 is rated for withstanding without suffering damage resulting from the Vds. Responsive to deassertion of NEG_OUT, the VOUT clamp 210 may cease efforts to control the gate of the power switch 202 and the OCP circuit 208 may again exert control over the gate of the power switch 202, decreasing Vgs of the power switch 202. In this way, the OCP circuit 208 and the VOUT clamp 210 operate in contrast to one another, seeking to cause opposite effects at the gate of the power switch 202. Such contrary operation results in a balancing point or hysteresis between the OCP circuit 208 and the VOUT clamp 210.

Responsive to TOUT decreasing in value to become less than ILIM_ocp, the OCP circuit may provide OCP having a deasserted value. Responsive to deassertion of OCP, the OCP circuit 208 and the VOUT clamp 210 may cease control over the gate of the power switch 202. Also, the current limiting circuit 206 may again be electrically coupled to the gate of the power switch 202 to again exert control over the power switch 202, controlling the power switch 202 to maintain TOUT at a value less than or equal to ILIM_servo. In this way, the power switch 202 is provided with high accuracy current limiting via the current limiting circuit 206 while also having a rapid transient response and short-circuit protection responsive to a rapid increase in value of TOUT, implemented via the OCP circuit 208 and the VOUT clamp 210. Also, the VOUT clamp 210 limits an increase in Vds of the power switch 202, thereby mitigating risks of damage to the power switch 202 as a result of an increased Vds. The VOUT clamp 210 may also enable implementation of low-voltage, low-area (e.g., area efficient) FETs as the power switch 202 that may have lower Vds ratings than other, larger, FETs.

Figure 3:
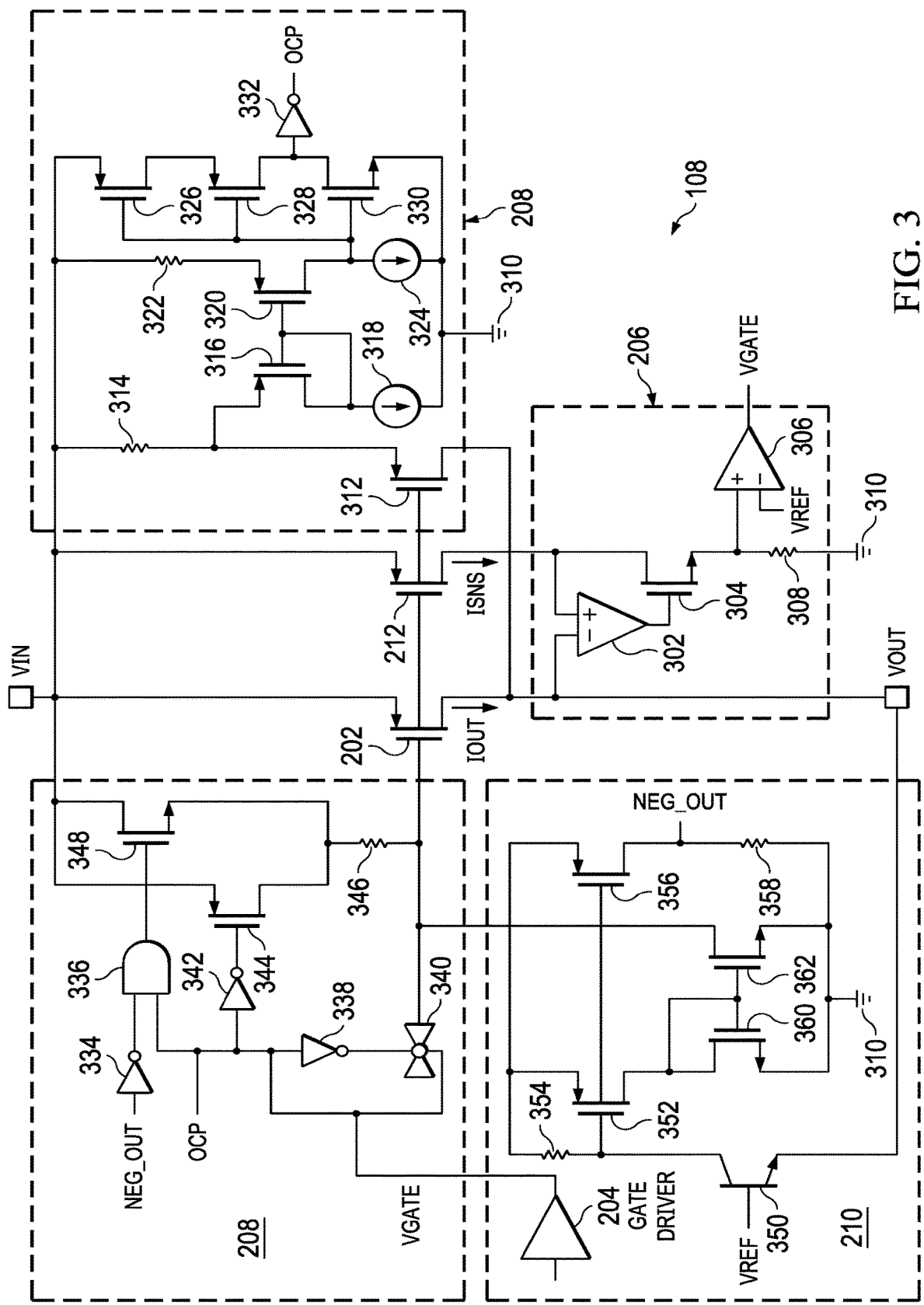
FIG. 3 is a schematic diagram of a power circuit, in accordance with various examples.

FIG. 3 is a circuit diagram of the power circuit 108, in accordance with various examples. As shown in FIG. 3, the current sense component 212 is a PET having a source coupled to the source of the power switch 202, a gate coupled to the gate of the power switch 202, and a drain. For example, the FET may be a scaled replica of the power switch 202, having a size determined such that a proportional, but smaller, amount of current flows through the current sense component 212 as flows through the power switch 202. In other implementations, the current sense component 212 may be implemented in other manners, such as a current sense resistor (not shown), etc. In at least some examples, the current limiting circuit 206 includes an error amplifier 302, a PET 304, an error amplifier 306, and a resistor 308. In an example implementation, the error amplifier 302 has an output, an inverting input coupled to a drain of the power switch 202, and a non-inverting input coupled to a drain of the current sense component 212. The FET 304 has a drain coupled to the drain of the current sense component 212, a gate coupled to the error amplifier 302 output, and a source. The error amplifier 306 has a non-inverting input coupled to the source of the FET 304, an inverting input configured to receive a reference voltage (Vref), and an output at which a control signal, VGATE, is provided. The resistor 308 is coupled between the source of the FET 304 and ground 310. In at least some examples, a ground voltage potential is provided at ground 310.

In at least some examples, the OCP circuit 208 includes a FET 312, a resistor 314, a PET 316, a current source 318, a PET 320, a resistor 322, a current source 324, a PET 326, a FET 328, a FET 330, and an inverter 332. Although not shown, in some examples the FET 326 and the PET 328 may be implemented as a single device having a channel length increased in comparison to a channel length of the FET 326 or the FET 328 individually. In an example implementation, the PET 312 has a source coupled to the source of the power switch 202 through the resistor 314, a gate coupled to the gate of the power switch 202, and a drain coupled to the drain of the power switch 202. The FET 316 has a source coupled to the source of the PET 312, a gate coupled to ground 310 through the current source 318, and a drain coupled to ground 310 through the current source 318. The PET 320 has a source coupled to the source of the power switch 202 through the resistor 322, a gate coupled to ground 310 through the current source 318, and a drain coupled to ground 310 through the current source 324. The PET 326 has a source coupled to the source of the power switch 202, a gate coupled to the drain of the PET 320, and a drain. The FET 328 has a source coupled to the drain of the FET 326, a gate coupled to the drain of the FET 320, and a drain. The FET 330 has a drain coupled to the drain of the FET 328, a gate coupled to the drain of the FET 320, and a source coupled to ground 310. The inverter 332 has an input coupled to the drain of the FET 328 and an output at which OCP is provided.

In at least some examples, the OCP circuit 208 also includes an inverter 334, a logical AND circuit 336, an inverter 338, a transmission gate 340, an inverter 342, a FET 344, a resistor 346, and a FET 348. In an example implementation, the inverter 334 has an input configured to receive NEG_OUT and an output. The logical AND circuit 336 has a first input coupled to the output of the inverter 334, a second input configured to receive OCP, and therefore coupled to the output of the inverter 332, and an output. The inverter 338 has an input coupled to the second input of the logical AND circuit 336 and an output. The transmission gate 340 has an input configured to receive VGATE, and therefore coupled to the output of the error amplifier 306, an output coupled to the gate of the power switch 202, an inverted control input coupled to the second input of the logical AND circuit 336, and a control input coupled to the output of the inverter 338. The inverter 342 has an input coupled to the second input of the logical AND circuit 336 and an output. The FET 344 has a source coupled to the source of the power switch 202, a gate coupled to the output of the inverter 342, and a drain coupled to the gate of the power switch 202 through the resistor 346. The FET 348 has a drain coupled to the source of the power switch 202, a gate coupled to the output of the logical AND circuit 336, and a source coupled to the gate of the power switch 202 through the resistor 346. In at least some examples, the PET 348 has a size larger than a size of the FET 344. For example, the FET 348 may have a length to with ration of about 10:1 and the FET 344 may have a length to width ration of about 2:1.

In at least some examples, the VOUT clamp 210 includes a bi-polar junction transistor (BJT) 350, a PET 352, a resistor 354, a PET 356, a resistor 358, a PET 360, and a FET 362. In an example implementation, the BJT 350 has a base configured to receive VREF, an emitter coupled to the drain of the power switch 202, and a collector. The FET 352 has a gate coupled to the collector of the BJT 350, a source coupled to the collector of the BJT 350 through the resistor 354, and a drain. The PET 356 has a gate coupled to the collector of the BJT 350, a source coupled to the source of the PET 352, and a drain coupled to ground 310 through the resistor 358. In at least some examples, the FET 356 is configured to provide NEG_OUT at its drain, and therefore is coupled at its drain to the input of the inverter 334. The FET 360 has a drain coupled to the drain of the FET 352, a gate coupled to the drain of the FET 352, and a source coupled to ground 310. The FET 362 has a drain coupled to the gate of the power switch 202, a gate coupled to the drain of the PET 352, and a source coupled to ground 310.

In an example of operation of the power circuit 108, the gate driver 204 receives a signal for driving the power switch 202 and provides a signal to the gate of the power switch 202 through the transmission gate 340 to cause the power switch 202 to be in a conductive state. Responsive to the power switch 202 being in a conductive state and a load (not shown) being present and coupled to the drain of the power switch 202, TOUT flows through the power switch 202. A scaled amount of current flows through the current sense component 212, where the scaled amount is determined by a ratio of sizes of the power switch 202 to the current sense component 212. Similarly, a scaled amount of current flows through the FET 312, where the scaled amount is determined by a ratio of sizes of the power switch 202 to the PET 312. The error amplifier 302 controls the FET 304 according to a difference in Vds of the power switch 202 and the current sense component 212. Such control causes an amount of current to flow through the PET 304 sufficient to cause Vds of the current sense element 212 to approximately equal Vds of the power switch 202. The error amplifier 306 provides VGATE having a value determined as a difference between a voltage across the resistor 308 and VREF. Based at least partially on VGATE, the power switch 202 is controlled to control a value of TOUT.

Responsive to TOUT exceeding ILIM_ocp, the OCP circuit 208 provides OCP having an asserted value. For example, responsive to TOUT rapidly increasing in value, TOUT will exceed both ILIM_servo and ILIM_ocp as a result of the response time of the current limiting circuit 206 in responding to TOUT exceeding ILIM_servo being insufficient to prevent TOUT from also exceeding ILIM_ocp. In some examples, ILIM_ocp may have a value about three times the value of ILIM_servo, or greater. In other examples, ILIM_ocp has any suitable value greater than ILIM_servo. The rapid rise in TOUT is reflected in a current flowing through the PET 312, and is reflected by the FET 316 to flow through the PET 320 as a mirrored current. Responsive to a value of the mirrored current exceeding a current of the current source 324, the OCP circuit 208 provides OCP having an asserted value. In at least some examples, a ratio of resistance of the resistor 314 and the resistor 322 is such that the OCP circuit 208 provides OCP having an asserted value responsive to the mirrored current exceeding about 4 microamperes (uA).

Responsive to assertion of OCP, the transmission gate 340 electrically decouples the output of the gate driver 204 and the output of the error amplifier 306 from the gate of the power switch 202. Also responsive to assertion of OCP, and while VOUT has a value greater than about −1 V (e.g., while NEG_OUT is deasserted), the logical AND circuit 336 provides a logical high signal to the gate of the FET 348, causing the FET 348 to become conductive. Also responsive to assertion of OCP, the inverter 342 provides a logical low signal to the gate of the FET 344, causing the FET 344 to become conductive. While conductive, the PET 344 and the FET 348 provide current to the gate of the power switch 202, increasing a voltage at the gate of the power switch 202 to be approximately equal in value to a voltage at the source of the power switch 202, decreasing Vgs of the power switch 202 and thereby turning off the power switch 202. While turned off, substantially no current flows from the source to the drain of the power switch 202, thereby reducing the value of TOUT.

In some examples, the rapid turn off of the power switch 202 causes VOUT to become negative in value. Responsive to VOUT becoming sufficiently negative in value that VREF-VOUT is greater than a base-to-emitter voltage (Vbe) of the BJT 350, the BJT 350 turns on and begins conducting current between its collector and emitter. The PET 352 amplifies a collector current of the BJT 350 and a current mirror formed by the FET 360 and the PET 362 sinking a mirrored current from the gate of the power switch 202 that is based on the amplified collector current. The mirrored current may be scaled from the amplified collector current based on a ratio of widths of the FET 362 to the FET 360. Sinking the mirrored current from the gate of the power switch 202 may decrease the voltage at the gate of the power switch 202, increasing Vgs of the power switch 202 and thereby turning on the power switch 202 to again cause TOUT to flow through the power switch 202. Also responsive to VOUT becoming sufficiently negative in value to turn on the BJT 350, NEG_OUT is asserted. Responsive to assertion of NEG_OUT, the logical AND circuit 336 provides a logical low signal to the gate of the FET 348, turning off the FET 348 to facilitate the decrease in voltage at the gate of the power switch 202. In at least some examples, the resistor 346 softens a gate voltage edge rate of the power switch 202 by degenerating the FET 348, such as to reduce a degree to which VOUT may turn negative during inductive fly-back in the power circuit 108.

Responsive to VOUT increasing in value such that VREF-VOUT is less than Vbe of the BJT 350, the BJT 350 stops conducting between its collector and emitter, NEG_OUT is deasserted, the FET 362 turns off and stops sinking current from the gate of the power switch 202, and, while OCP is asserted, the FET 348 turns on and operates as described above. Responsive to IOUT decreasing in value to be less than ILIM_ocp, OCP is deasserted, the PET 344 and the FET 348 (if still turned on) are turned off, and the transmission gate 340 electrically couples the output of the gate driver 204 and the output of the error amplifier 306 to the gate of the power switch 202, returning to operation under control of the current limiting circuit 206, as described above.

FIG. 4A is a graph 400 of signals in a power circuit, in accordance with various examples. In at least some examples, the power circuit is the power circuit 108 with the OCP circuit 208 and the VOUT clamp 210 omitted. The graph 400 includes TOUT on a vertical scale of current in units of amperes (A) and a horizontal scale of time in units of milliseconds (ms). The graph 400 also includes VDS of the power switch 202 and VOUT on a vertical scale of voltage in units of V and the same horizontal scale as TOUT. The graph 400 assumes a value of VIN of 5.5 V, an input capacitance of 100 microfarads (uF), an output capacitance of 2 uF, and an output inductance of 150 nanohenries (nH). As shown by the graph 400, in the absence of the OCP circuit 208 and the VOUT clamp 210, responsive to a rapid increase in value of TOUT, VOUT decreases in value. In some examples, VOUT decreases in value to a negative value. Responsive to the decrease in value of VOUT, VDS increases in value. For some implementations of the power circuit 108, in the absence of the OCP circuit 208 and the VOUT clamp 210 and operating under the conditions described above, VOUT may decrease to a value of approximately −1.9 V and VDS may resultingly increase to a value of approximately 7.4 V. For some power switches, such as low voltage power switches, the 7.4 V VDS may result in damage to the power switch.

Figure 4B:
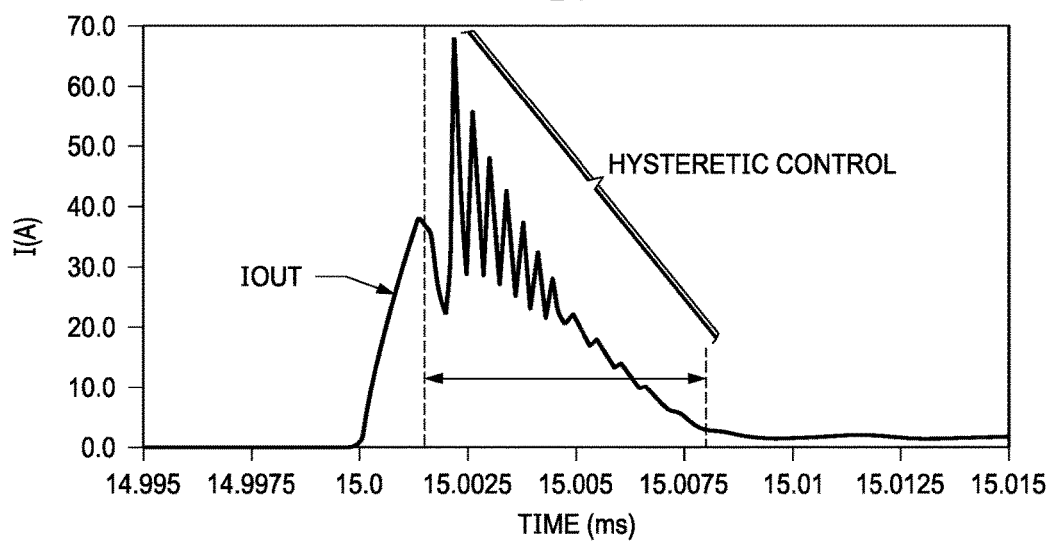
FIG. 4B is a graph of signals in a power circuit, in accordance with various examples.
Figure 4B:
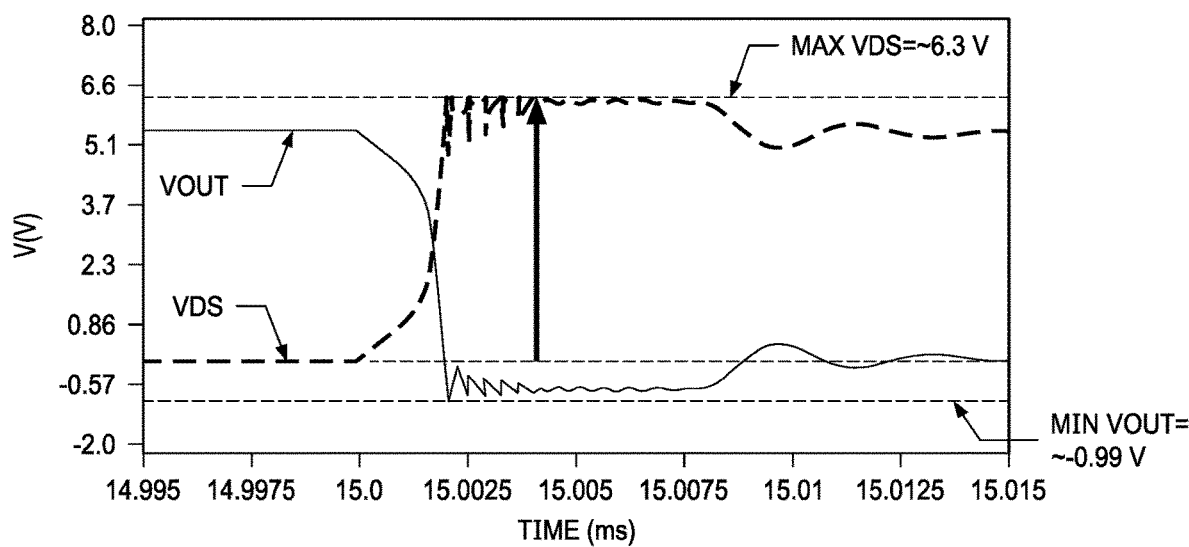

FIG. 4B is a graph 450 of signals in a power circuit, in accordance with various examples. In at least some examples, the power circuit is the power circuit 108 with the current limiting circuit 206, the OCP circuit 208, and the VOUT clamp 210. The graph 450 includes TOUT on a vertical scale of current in units of A and a horizontal scale of time in units of ms. The graph 450 also includes VDS of the power switch 202 and VOUT on a vertical scale of voltage in units of V and the same horizontal scale as IOUT. The graph 400 assumes a value of VIN of 5.5 V, an input capacitance of 100 uF, an output capacitance of 2 uF, and an output inductance of 150 nH. As shown by the graph 450, responsive to a rapid increase in value of IOUT, VOUT decreases in value. In some examples, VOUT decreases in value to a negative value and is clamped at a programmed negative value by the VOUT clamp 210. Responsive to the decrease in value of VOUT, VDS increases in value. For some implementations of the power circuit 108 operating under the conditions described above, VOUT may decrease to a programmed VOUT clamp value of approximately −0.99 V and VDS may resultingly increase to a value of approximately 6.3 V. More generally, by programming a VOUT clamp value via component values of the VOUT clamp 210, VDS may be limited to approximately a value of a supply voltage minus the VDS clamp value. The VDS clamp value may be selected such that the resulting VDS is less than a VDS value for which a power switch having the VDS is rated, such as a maximum VDS rating of the power switch. For some power switches, such as low voltage power switches and/or the power switch 202, the 6.3 V VDS may be within a VDS tolerance range of the power switch and case damage to the power switch as a result of the VDS value. As also shown by the graph 450, the OCP circuit 208 and the VOUT clamp 210 alternatingly source current to and sink current from the gate of the power switch 202 to decrease the value of TOUT while maintaining VOUT at approximately the programmed VOUT clamp value or greater, implementing hysteretic control of the power switch 202, as described above herein.

Figure 5:
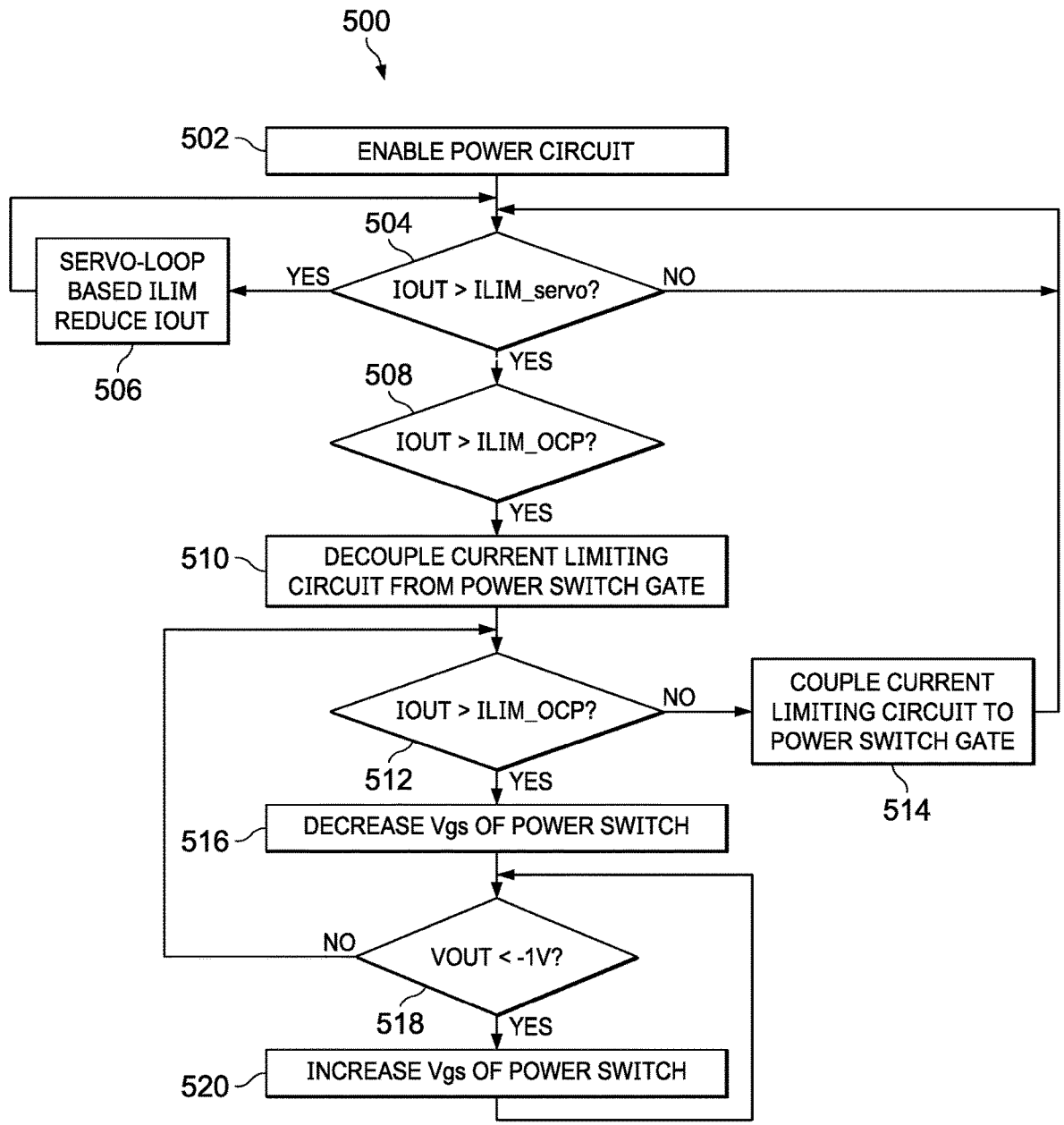
FIG. 5 is a flow diagram of a method for controlling a power circuit, in accordance with various examples.

FIG. 5 is a flowchart of a method 500 of control of a power circuit, in accordance with various examples. In at least some examples, the method 500 is implemented by the power circuit 108, such as via a combination of the current limiting circuit 206, the OCP circuit 208, and/or the VOUT clamp 210. Accordingly, reference may be made in describing the method 500 to components of any of the preceding figures of this description.

At operation 502, the power circuit 108 is enabled. In some examples, the power circuit 108 may be enabled by providing an asserted signal to the gate driver 204. Enabling the power circuit 108 turns on the power switch 202 such that VOUT is provided at a drain of the power switch 202 and TOUT flows through the power switch 202.

At operation 504, the current limiting circuit 206 determines whether TOUT is greater in value than ILIM_servo. For example, the current limiting circuit 206 compares a voltage representative of ISNS to VREF. Responsive to the voltage representative of ISNS being greater in value than VREF, the current limiting circuit 206 determines that TOUT is greater in value than ILIM_servo. Responsive to determining that TOUT is not greater in value than ILIM_servo, the method 500 remains at operation 504. Responsive to determining that TOUT is greater in value than ILIM_servo, the method 500 proceeds to both operation 506 and operation 508.

At operation 506, the current limiting circuit 206 performs servo-loop based control to reduce TOUT. For example, the current limiting circuit 206 provides VGATE to the gate of the power switch 202 having a value determined to cause a decrease in value of TOUT.

At operation 508, the OCP circuit 208 determines whether TOUT is greater in value than ILIM_ocp. Responsive to determining that TOUT is greater in value than ILIM_ocp, the OCP circuit 208 provides OCP having an asserted value and the method 500 proceeds to operation 510.

At operation 510, the transmission gate 340 electrically decouples the current limiting circuit 206 from the gate of the power switch 202 and proceeds to operation 512.

At operation 512, the OCP circuit 208 determines whether TOUT is greater in value than ILIM_ocp. Responsive to determining that TOUT is not greater in value than ILIM_ocp, the OCP circuit 208 provides OCP having a deasserted value and the method 500 proceeds to operation 514.

At operation 514, the transmission gate 340 electrically couples the current limiting circuit 206 to the gate of the power switch 202 and proceeds to operation 504.

Referring again to operation 512, responsive to determining that TOUT is greater in value than ILIM_ocp, the OCP circuit 208 provides OCP having the asserted value and the method 500 proceeds to operation 516.

At operation 516, the OCP circuit 208 increase a voltage provided at the gate of the power switch 202 to decrease Vgs of the power switch 202, turning off the power switch 202. Turning off the power switch 202 at operation 516 may cause a value of TOUT to become reduced. The method 500 next proceeds to operation 518.

At operation 518, the VOUT clamp 210 determines whether VOUT is less than −1 V. For example, responsive to the decrease in value of TOUT, in some examples of the power circuit 108, VOUT may become negative in value. Responsive to the VOUT clamp 210 determining that VOUT is not less than −1 V, the VOUT clamp provides NEG_OUT having a deasserted value and the method 500 returns to operation 512. Responsive to the VOUT clamp 210 determining that VOUT is less than −1 V, the VOUT clamp 210 NEG_OUT having an asserted value and the method 500 proceeds to operation 520.

At operation 520, the VOUT clamp 210 decreases the voltage provided at the gate of the power switch 202 to increase Vgs of the power switch 202, turning on the power switch 202. Turning on the power switch 202 at operation 520 may cause a value of IOUT to increase and may maintain VOUT approximately at, or above, a programmed VOUT clamp value. Also at operation 520, the asserted value of NEG_OUT may cause the OCP circuit 208 to reduce a voltage provided by the OCP circuit 208 to the gate of the power switch 202, such as by turning off a transistor of the OCP circuit 208. The method 500 next returns to operation 518.

The term "couple" appears throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

The phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

What is claimed is:

1. A method for controlling a power circuit, comprising:
    enabling the power circuit;
    determining, by a current sense component, whether an output current of the power circuit is greater than a first current limit threshold;
    reducing, using a current limiting circuit coupled to a power switch, the output current in response to the output current being greater than the first current limit threshold;
    determining, by an over-current protection circuit, whether the output current is greater than a second current limit threshold;
    decoupling the current limiting circuit from the power switch in response to the output current being greater than the second current limit threshold;
    determining, by an over-current protection circuit after the decoupling the current limiting circuit, whether the output current is greater than the second current limit threshold;
    coupling the current limiting circuit to the power switch in response to the output current being less than the second current limit threshold; and
    limiting an increase in voltage across the power switch using a voltage clamp circuit that includes:
        a bi-polar junction transistor (BJT) having a collector, an emitter, and a base, the base configured to receive a reference voltage, and the emitter coupled to a drain of the power switch;
        a first field effect transistor (FET) having a first FET drain, a first FET gate, and a first FET source, the first FET gate coupled to the collector, and the first FET source coupled to the collector through a first resistor;

a second FET having a second FET drain, a second FET source, and a second FET gate, wherein the second FET drain and the second FET gate are coupled to the first FET drain, and the second FET source is coupled to a ground terminal;

a third FET having a third FET drain, a third FET source, and a third FET gate, wherein the third FET gate is coupled to the first FET drain, the third FET drain is coupled to a gate of the power switch, and the third FET source is coupled to the ground terminal; and a fourth FET having a fourth FET drain, a fourth FET source, and a fourth FET gate, wherein the fourth FET gate is coupled to the collector, the fourth FET source is coupled to the collector through the first resistor, and the fourth FET drain is coupled to the ground terminal through a second resistor, wherein a negative output detection signal is provided at the fourth FET drain.

2. The method of claim 1, wherein the enabling the power circuit includes providing an assertion signal to a driver circuit that is coupled to the power switch.

3. The method of claim 1, wherein the current limiting circuit is a servo-loop based current limit controller.

4. The method of claim 1, further comprising turning off the power switch by decreasing a bias voltage on the power switch in response to the output current being greater than the second current limit threshold.

5. The method of claim 4, further comprising turning on the power switch, after turning off the power switch, by increasing the bias voltage on the power switch in response to the output current being less than the second current limit threshold.

6. The method of claim 1, wherein the over-current protection circuit includes:
   a first transistor coupled to the power switch through a third resistor;
   a second transistor coupled to the first transistor and to the ground terminal through a first current source;
   a third transistor coupled to the power switch through a fourth resistor and to the ground terminal through a second current source, and having a control terminal coupled to the ground terminal through the first current source;
   a fourth transistor coupled to the power switch, and having a control terminal coupled to the third transistor;
   a fifth transistor coupled to the fourth transistor, and having a control terminal coupled to the third transistor;
   a sixth transistor coupled between the fifth transistor and the ground terminal, and having a control terminal coupled to the third transistor; and
   an inverter having an inverter input and an inverter output, wherein the inverter input is coupled to the sixth transistor, and the inverter is configured to provide an over-current protection detection signal at the inverter output.

7. The method of claim 6, wherein the inverter is a first inverter, the inverter input is a first inverter input, the inverter output is a first inverter output, and the over-current protection circuit further includes:
   a second inverter having a second inverter input and a second inverter output, wherein the second inverter input is configured to receive a negative output detection signal;
   a logical AND circuit having first and second AND inputs and an AND output, wherein the first AND input is coupled to the second inverter output, and the second AND input is coupled to the first inverter output;
   a third inverter having a third inverter input and a third inverter output, wherein the third inverter input is coupled to the first inverter output;
   a transmission gate having a transmission gate input, a transmission gate output, a transmission gate control input, and a transmission gate inverted control input, wherein the transmission gate input is configured to receive a gate control signal, the transmission gate output is coupled to the power switch, and the transmission gate inverted control input is coupled to the first inverter output;
   a fourth inverter having a fourth inverter input and a fourth inverter output, wherein the fourth inverter input is coupled to the first inverter output, and the fourth inverter output coupled to the transmission gate control input;
   a seventh transistor coupled to the power switch, and having a control terminal coupled to the AND output; and
   an eighth transistor coupled to the power switch, and having a control terminal coupled to the third inverter output.

8. The method of claim 7, further comprising a gate driver having a driver input and a driver output, wherein the driver input is configured to receive a power switch drive signal, and the driver output is coupled to the transmission gate input.

9. The method of claim 3, wherein the over-current protection circuit is configured to control the power switch to regulate the output current, and the second current limit threshold is greater than the first current limit threshold.

10. An apparatus, comprising:
    a current limiting circuit coupled to a power switch and configured to control the power switch to regulate an output current to remain below a first threshold, wherein the current limiting circuit includes:
       a first error amplifier having a first inverting input, a first non-inverting input, and a first error amplifier output, wherein the first inverting input is coupled to a power switch drain, and the first non-inverting input is coupled to a current sense component;
       a field effect transistor (FET) having a FET drain coupled to the current sense component, a FET gate coupled to the first error amplifier output, and a FET source coupled to a ground terminal; and
       a second error amplifier having a second inverting input, a second non-inverting input, and a second error amplifier output, wherein the second non-inverting input is coupled to the FET source, the second inverting input is coupled to a reference voltage terminal, and the second error amplifier is configured to provide a gate control signal at the second error amplifier output;
    an over-current protection circuit coupled to the power switch and configured to control the power switch to regulate the output current to remain below a second threshold that is greater than the first threshold; and
    an output voltage clamp coupled to the power switch and configured to control the power switch to maintain an output voltage greater than a third threshold, wherein the output voltage clamp includes:
       a bi-polar junction transistor (BJT) having a collector, an emitter, and a base, the base configured to receive a reference voltage, and the emitter coupled to a drain of the power switch;

a first field effect transistor (FET) having a first FET drain, a first FET gate, and a first FET source, the first FET gate coupled to the collector, and the first FET source coupled to the collector through a first resistor;
a second FET having a second FET drain, a second FET source, and a second FET gate, wherein the second FET drain and the second FET gate is coupled to the first FET drain, and the second FET source is coupled to the ground terminal;
a third FET having a third FET drain, a third FET source, and a third FET gate, wherein the third FET gate is coupled to the first FET drain, the third FET drain is coupled to a gate of the power switch, and the third FET source is coupled to the ground terminal; and
a fourth FET having a fourth FET drain, a fourth FET source, and a fourth FET gate, wherein the fourth FET gate is coupled to the collector, the fourth FET source is coupled to the collector through the first resistor, and the fourth FET drain is coupled to the ground terminal through a second resistor, wherein a negative output detection signal is provided at the fourth FET drain.

11. The apparatus of claim 10, wherein the third threshold is a negative value.

12. The apparatus of claim 10, wherein the current limiting circuit is a servo-loop based current limit controller.

13. The apparatus of claim 10, wherein the over-current protection circuit is configured to control the power switch by providing current to a gate of the power switch to decrease a gate-to-source voltage of the power switch.

14. The apparatus of claim 10, wherein the output voltage clamp is configured to control the power switch by sinking current from a gate of the power switch to increase a gate-to-source voltage of the power switch.

15. The apparatus of claim 14, wherein the output voltage clamp is configured to prevent the over-current protection circuit from turning off the power switch in response to the output voltage.

16. The apparatus of claim 10, wherein the current limiting circuit is configured to respond to slew rate increases in the output current that are less than a threshold, and the over-current protection circuit is configured to respond to slew rate increases in the output current that are greater than the threshold.

* * * * *